United States Patent [19]
Casey

[11] Patent Number: 5,477,283
[45] Date of Patent: Dec. 19, 1995

[54] IMAGE PROJECTING DEVICE

[76] Inventor: Alan F. Casey, 548 Princeaway Ct., Manchester, Mo. 63011

[21] Appl. No.: 290,541

[22] Filed: Aug. 15, 1994

Related U.S. Application Data

[63] Continuation-in-part of Ser. No. 64,905, May 24, 1993, abandoned.

[51] Int. Cl.⁶ .................................................. G03B 21/00
[52] U.S. Cl. ................................................ 353/62; 353/12
[58] Field of Search ..................................... 353/11, 22–24, 353/28, 42–43, 62, 84–85, 87, 119, DIG. 3; 362/418–419, 427, 430; 33/614–616

[56] References Cited

U.S. PATENT DOCUMENTS

| | | | |
|---|---|---|---|
| 1,856,956 | 5/1932 | Jordan | 353/62 |
| 2,341,223 | 2/1944 | Lillie | 353/62 |
| 3,323,415 | 6/1967 | Tobias | 353/62 |
| 3,749,485 | 7/1973 | Carter et al. | 353/62 |
| 4,149,775 | 4/1979 | Blake . | |
| 4,217,047 | 8/1980 | Jacksen | 353/28 |
| 4,910,541 | 3/1990 | Morgan | 353/28 |
| 4,953,822 | 9/1990 | Sharber et al. | 248/281.1 |

*Primary Examiner*—William A. Cuchlinski, Jr.
*Assistant Examiner*—William C. Dowling

[57] ABSTRACT

An optical projecting device accurately aligns figures, letters and symbols using images, and grid lines projected on a work area during such tasks as graphic design layout. Prior art solutions to the problem of eliminating penciled guide lines to improve such graphic design layout involve the projection of reference lines. But one drawback is that there is no provision for moving, repositioning, or partially rotating, the images and reference lines relative to the work piece during the design layout operation. Another is that they include no provision for changing the image sizes when required during the progress of the work. A different technology as well as different illumination precepts overcome prior art drawbacks. The unit is the type which includes a housing, a light source within the housing, and an image bearing transparent panel. But the transparent panel is carried in a retainer adapted to be rotated. In addition swivel and pivotal means are provided for raising, lowering and moving the projecting unit.

4 Claims, 2 Drawing Sheets

IMAGE PROJECTING DEVICE

RELATED APPLICATIONS

This patent application is a continuation-in-part of my earlier patent application Ser. No. 08/064,905 filed May 24, 1993, and now abandoned.

BACKGROUND OF THE INVENTION

This invention, in one of its aspects, relates to optical devices which project images and guide lines on a work surface. In a more specific aspect this invention pertains to units projecting guide lines or grid lines for use in accurately aligning figures, letters, symbols and other images during lay out operations. In the course of graphic design operations, such tasks as image layout, the aligning with their backgrounds of letters or words for posters and signs, architectural design, mosaic tile design, type setting, and similar lay up work require guidelines for proper alignment. The provision of guide lines is best accomplished optically.

An optical paste-up aligning device is described in U.S. Pat. No. 3,323,415. The aligning device will transmit guide line images and superimpose them on the surface of a paste-up paper or base sheet so that an operator can easily produce paste-up copy with all of the individual pieces in their proper relationships. When the screen is positioned between a grid plate and the paste-up sheet, a virtual image of the grid is obtained which appears to be superimposed in the plane of the paste up. This image can then be used as a guide for pasting down the pieces during the paste-up operation. As pointed out in that patent, previously, in order to obtain the proper alignment of copy it was necessary to use a T-square, triangles and rulers.

Another projector of the same type is the subject of U.S. Pat. No. 3,749,485. The principles of shadow-line projectors are used in establishing reference lines to assist workmen in assembling a number of components in particular dimensional relationships with each other. Known forms of shadow-line devices are not practical for this sort of assembly operation. The projector disclosed in U.S. Pat. No. 3,749,485 establishes a series of stripes on a transparent sheet. The stripes are opaque and of such a width that they project a particular width of shadow on the work surface. The reference shadow-lines are generated by intercepting light from a light source with the interference lines established by the stripes.

A still different type of projector is the subject of U.S. Pat. No. 4,910,541. In this patent the difficulties of using a T-square and triangle are also alluded to. The handling of these implements is awkward and time consuming. In addition one's hands are not free to work with the laying of small pieces. A light line projecting device is described wherein measured bars of light are simply adjusted over the layout sheet. A horizontal bar of light is moved by merely adjusting a turn knob which can move the light bar down the work sheet, starting from the top. Measuring rulers are provided, one across the top of the work sheet supporting platform, and the other ruler along one side edge of the work sheet. The light bars provide the straight edge guides by which paste up or lay out operations can be carried out.

The prior art can be further exemplified by U.S. Pat. No. 4,696,400 directed to a kit for creating wall murals. The kit includes a slide transparent panel and a projector for projecting the image on the transparent panel onto a selected wall.

The prior art patents solve the problem of improving paste up, lay out, and drawing operations by eliminating penciled in guide lines through the projection of reference lines. But a review of that art reveals that they are subject to improvement. One drawback is that there is no provision for moving, repositioning, or partially rotating, the images and reference lines relative to the work piece during the design layout operation. In addition they include no provision for changing an image size in, say, one portion of the work when such changes are required during the progress of the work. In U.S. Pat. No. 3,323,415, for instance, the light source and grid plate are installed in a housing, fixing the distance from the paste-up sheet. In U.S. Pat. No. 3,749,485 the projector is mounted on a framework as shown in FIG. 1 of that patent. This also allows for only one preset distance between the projector and the work surface. In U.S. Pat. No. 4,910,541 a framework also fixes the distance of the light projecting fixture from the work area. Likewise the wall mural kit is secured to an opposite wall by nails, pins or screws. This also fixes the distance of the device from the work surface.

More important, it is frequently necessary to turn or angle the reference lines from their starting positions during the lay up operation to achieve an angular effect. The prior art devices do not allow such latitude, and hence are often ineffective. A case might possibly be made for the combination of U.S. Pat. No. 2,717,530 with U.S. Pat. No. 5,103,384. However U.S. Pat. No. 2,717,530 is concerned with a hand-held optical pointer, and U.S. Pat. No. 5,103,384 discloses a flashlight holder for mechanics requiring light while working on automobiles. To replace the flashlight in a flashlight holder with a pointer designed to be hand-held is contrary to the hand-held pointer invention. It is stated in U.S. Pat. No. 2,717,530 that various pointing positions are shown in FIG. 1. It is obvious that they can be achieved by turning or twisting the hand which is holding the pointer. A diaphragm plate can be rotated by the finger or thumb. Obviously this would be supplemental, such as for minor adjustments or fine tuning.

Herein, then, not only are partial rotation of guide lines provided for, but size changing disadvantages of the prior art apparatus are overcome. As will be apparent a device is provided which utilizes different projecting precepts. Means are provided for ensuring that parallel guide lines are projected.

SUMMARY OF THE INVENTION

A device is provided herein for projecting guide lines on a work surface The device includes a projecting apparatus, an apparatus base adapted to be attached to a table, wall or ceiling, and a connecting arm. Means are employed for pivotally attaching one end of the connecting arm to the apparatus base, and for swivelly connecting the other end of the connecting arm to the projecting apparatus. The pivotal means permits the projecting unit to be moved vertically and horizontally relative to the base. The swivel means permits the projecting apparatus to be rotated. The projecting apparatus includes a housing, a light source within the housing, a transparent panel spaced therefrom so that light passes therethrough, and a focusing lens carried by the housing so that the lens is between the transparent panel and the work surface. A retainer holds the transparent panel. The transparent panel can also be rotated so that lines can be projected on the work surface at any angle. It can be seen that by this device almost any degree of guide line orientation can be achieved. In addition the transparent panel has a set of lines on its surface, lines to be projected on the work surface as guide lines.

DETAILED DESCRIPTION OF THE INVENTION

As noted, prior art reference line projecting devices do not allow the designer any latitude for changing the attitude and spacing of those reference lines during layout or lay up. For instance if several sizes or shapes of letters or angular arrangements of those letters are involved, known projecting devices are ineffective. They do not permit changing the reference lines. The projecting apparatus herein includes components which do allow that latitude. This apparatus can, perhaps, best be understood by reference to drawings.

BRIEF DESCRIPTION OF THE DRAWINGS

Referring now to FIG. 1, the entire projecting apparatus is shown therein. The projecting apparatus includes a projecting unit 2, an adjustable arm 4, and a mounting element 6. The adjustable arm shown in FIG. 1 is a counter-balanced arm made up of arms 8 and 10 and elbow 12. Counterbalancing is accomplished as is known in the art by spring means 14 and 16.

Figure 2:
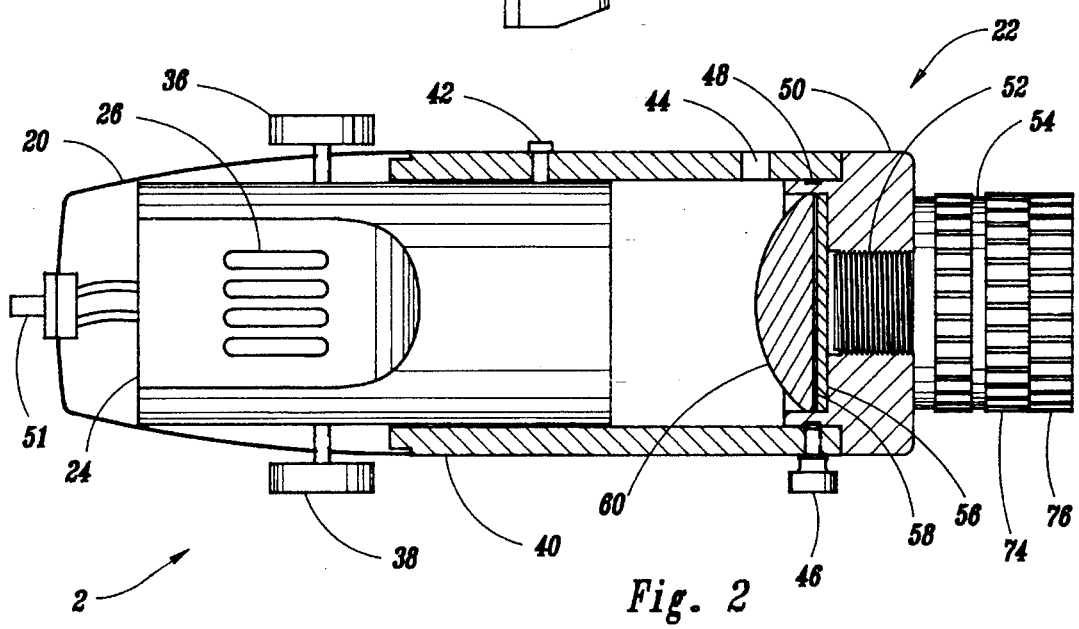
FIG. 2, partially in section shows the internal structure of the device which differs from the prior art.

The projecting unit of the invention is shown in detail in FIG. 2. It includes a lamp shell 20 containing a lamp housing 24 having cooling holes 26 in the periphery thereof. Within the housing is a lamp bulb in a socket and accompanying wiring. Since such light sources are conventional the lamp has not been shown in the drawing. Many such lamps are commercially available, a halogen lamp fixture being preferred herein. If desired a diffusion and/or cooling lens can be installed in the lamp housing.

Figure 1:
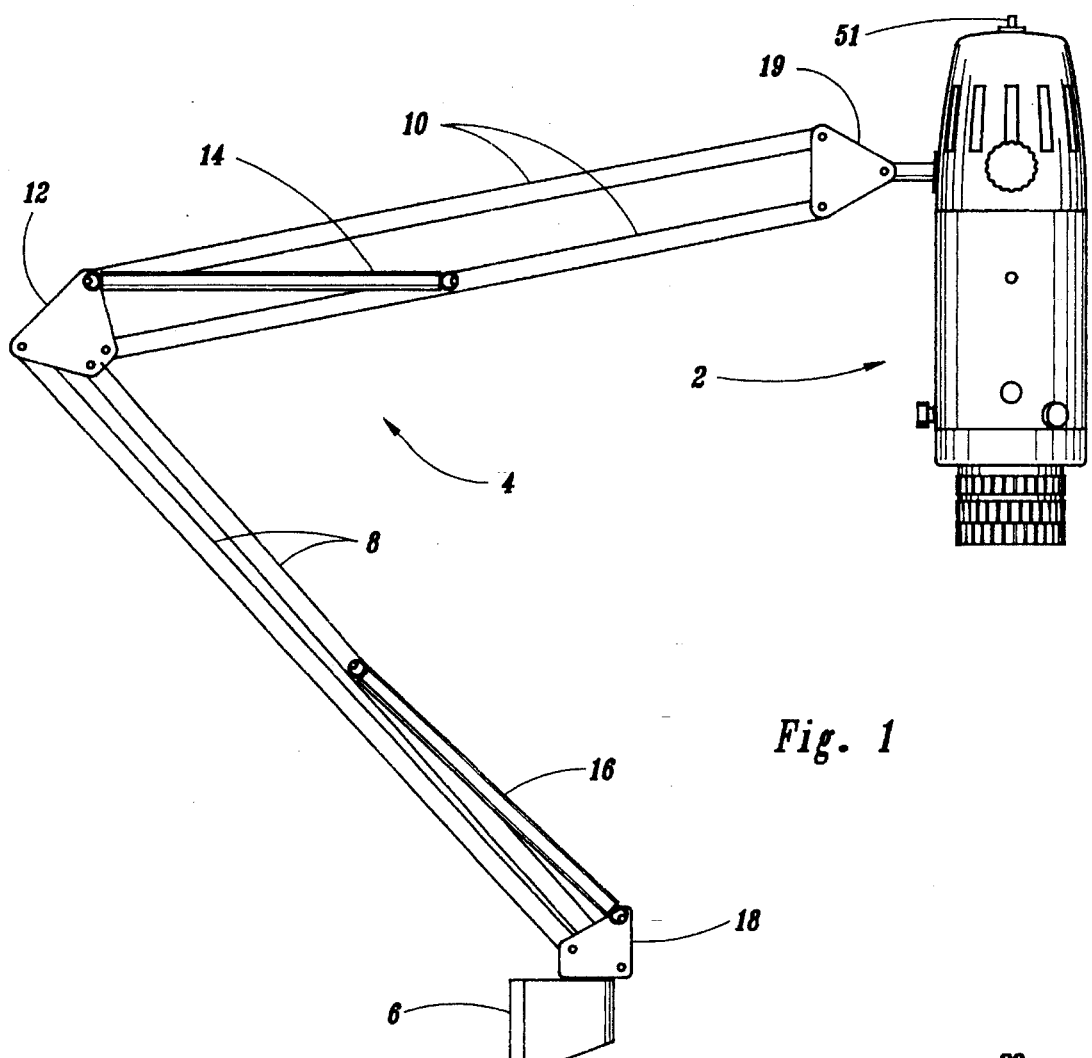
FIG. 1 is a side elevation of a preferred device of this invention.

Shell 20 is attached to joint 19 (FIG. 1) to support projecting unit 2. Retaining screws 36 and 38 pass through screw holes in shell 20, and into threaded holes in lamp housing 24 as shown in FIG. 2. Also shown is a switch 51 (FIG. 2).

In use, adjustable arm 4 carries the projecting unit 2. The free end 18 of arm 4 is connected to mounting element 6 which can be a base, a clamp, or a plate adapted for attachment to a table, desk, floor, wall, or any other surface above or beside a working area. To attachment 19 on the free end of arm 4 projecting unit 2 is secured. Attachment 18 at the base of adjustable arm 4 is normally a swivel joint to allow the projecting unit to be swung out of the way, but its importance is as a swivel joint. The important arm elements, then, are swivel joint 18, and pivot joint or elbow 12 permitting projecting unit 2 to be moved both vertically and horizontally.

While adjustable arms are used on desk lamps such arms have not been employed to permit a reference line projecting unit to be moved up and down, and back and forth above a work area. In addition attachment 19 is also a swivel joint, permitting further adjustment of projecting unit 2. Such freedom of guide line orientation or movement is new to guide line projecting apparatus as revealed by the prior art described in the background of this invention.

A significant component of this invention is lens unit 22 which provides even more latitude in positioning reference lines. The unit includes an adapter sleeve 40 carrying the lens 54 and transparent panel 58. This transparent panel has on its surface a set of lines which are projected by lens 54 as guide lines or reference lines on the working surface. Sleeve 40 is attached to lamp housing 24 by retaining screw 42. Since sleeve 40 fits slidably on lamp housing 24, one such retaining screw is sufficient. Sleeve 40, like the lamp housing, is provided with one or more cooling holes 44.

An important element of this invention is lens adapter 50 which is supported in the lower end of housing sleeve 40. Lens adapter 50 is held within housing sleeve 40 by dog point bolts 46 residing in groove 48 to render the adapter capable of rotation. Lens adapter 50 has a threaded opening 52 into which compound lens 54 is inserted as shown in FIG. 2.

Another feature of the invention is transparent panel seat 56. The transparent panel 58 is seated in seat 56 and held therein by a frame, glass, or otherwise. This construction permits the angulation or partial rotation of transparent panel or slide 58.

In operation the light is turned on by depressing switch 51 and the sizing of the reference lines is accomplished by adjusting the height of projecting unit 2 through adjusting arm 4 in steps similar to those taken in photograph enlarging. Contrary to photography, once the size is established, the orientation of the reference lines is achieved by turning lens adapter 50. Lamp unit 20 can also be partially rotated because of the construction of joint 19.

Figure 3:
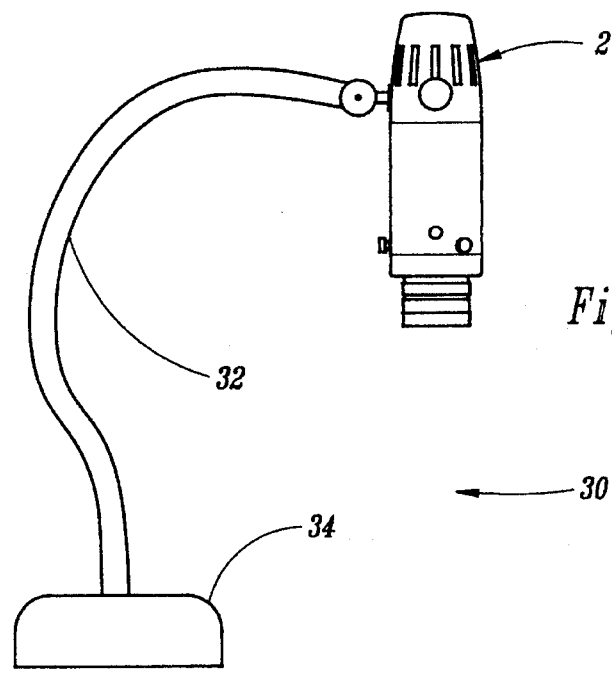
FIG. 3 is a side elevation similar to FIG. 1 but of a different embodiment of the invention.

Even though the adjustable arm illustrated is a counterbalanced arm, other adjustable arms can be used, such as floating arms, gooseneck arms, and the like. A gooseneck arm projecting unit 30 is illustrated in FIG. 3. Optical unit 2 is the same as that described in conjunction with FIG. 1. That unit is carried by gooseneck 32 attached to a base 34 which can stand on a desk, table or other surface.

It will be appreciated that in prior art reference line projecting apparatus, and even in photographic equipment the guide lines cannot be oriented and placed at any desired angle as herein. Because of the ability to position the transparent panel, more latitude is allowed by the projecting apparatus of this invention than is possible with prior art apparatus.

Figure 5:
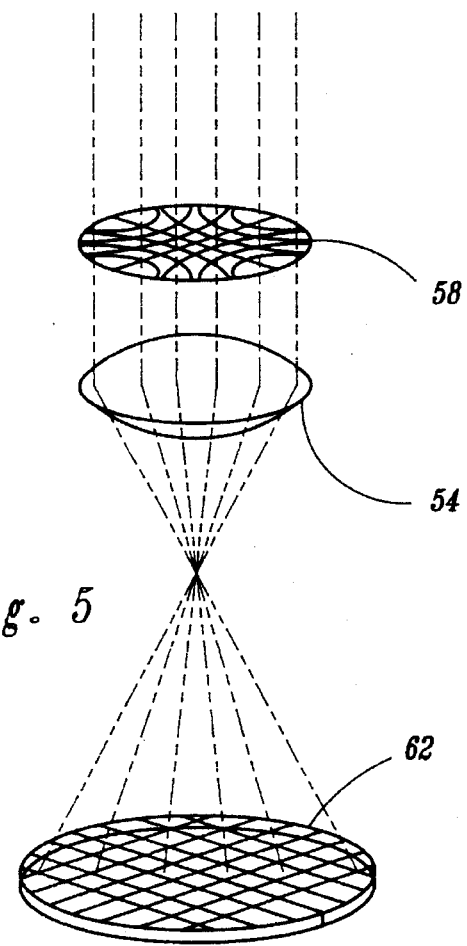
FIG. 5 is a schematic view depicting a lens aberration compensation aspect of the invention.

An equally important feature of this invention entails means taking lens aberrations into account. It is known that images seen through a lens have a bent appearance over the area of the lens. These lens deficiencies are known as aberrations, and must be accounted for in projections as well as in photography. They can be minimized but not eliminated, the degree of minimization depending on lens complexity, and hence lens cost. In the case of convex lens the image seems to curve away from the edges of the glass (lens). In concave lens the image seems to curve toward the edges. By this invention I compensate for these nonparallel guide lines resulting from lens aberrations. In effect I determine the curvature of the projected lines and mathematically ascribe these curvatures to the lines being projected. As a result of these calculations nonparallel lines, either horizontal, vertical or both are placed on the surface of the glass panel 58 as illustrated in FIG. 5. When these nonparallel lines are projected on the work surface they become substantially parallel guide lines, thus compensating for the aberrations. This aspect is illustrated schematically in FIG. 5. FIG. 5 is an isometric depiction of transparent panel 58 and lens 54. On transparent panel 58 are nonparallel guide lines, which when projected as shown become parallel grid lines 62. The calculations are based on the curvature of the lens, and will be different for each lens. For most uses extreme accuracy is not a requirement. Accordingly point by point corrections can be derived by standard curve fitting techniques. Thus, parallel guide lines are projected and the curve fitting techniques are applied to render the curved projections virtually parallel. The resulting formula is then used to form nonparallel lines on the slide or transparent panel so configured that they project as substantially parallel guide lines. The curve fitting is thus lens dependent. As an example, using a 25 mm f1.4 lens with a range of 0.5 m to infinity the projected lines were adapted to a Cartesian coordinate system. Corrections to substantially parallel lines were found to follow the formulas $x=13/16y$ and $y=13/16x$. With these formulas a transparent panel bearing nonparallel lines which project as substantially parallel lines was computer generated. Obviously other and perhaps more sophisticated, techniques are known, such as those utilizing geometric optics and extensive ray-tracing calculations with computers.

Figure 4:
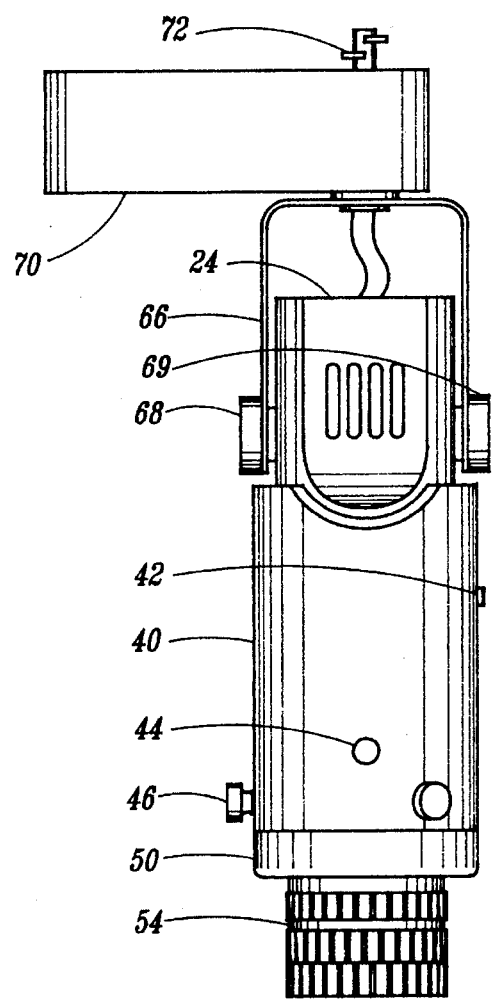
FIG. 4 is a side view of still another embodiment of the invention.

Frequently it will be desirable to utilize the projecting apparatus of the invention in an office or studio where track lighting has been installed. Such a device is illustrated in FIG. 4. In general the projecting unit per se is the same as that shown in FIG. 2, including the lamp housing 24 with adapter sleeve 40 held by retaining screws 42, along with lens adapter 50, dog point bolts 46 and compound lens 54. Instead of shell 20 of FIG. 3, however, projecting unit 2 is carried by clevis 66 having bolts 68 and 69 passing through its two ends into lamp housing 24. Attached to the top of clevis 66 is a power box 70 which can house the necessary wiring, and, if desired, a transformer and other electrical components for a halogen fixture. Projecting from the top of power box 70 are contacts 72 which can be locked in a lighting track as is known in the art.

In the light of the description of the various components and aspects of the invention herein ramifications and variations of the invention will be occur to those skilled in the art. As an example, to hold down the transparent panel or slide a condensing lens can be used such as lens 60 shown in FIG. 2. It is to be understood also that by the use of different transparent panels different arrangements of guide lines can be employed as reference lines, particularly those corrected for aberrations, for lettering, tracing, templates, letter lay up and the like. It will also be apparent that whereas push button switches are shown, any number of switches are available. In addition in the optical art lens openings or stops are common. An examination of the drawing shows that lens 54 is a two component lens including an upper portion 74 and a lower portion 76. The lens includes an adjustable aperture, not shown, by which the lens opening is made larger or smaller by rotating lower component 76 relative to component 74. Further, a zoom lens can be employed, particularly in ceiling track mounted units to assist in one dimension of movement. It will also be appreciated that the adapter sleeve 40 is not essential, but convenient from a manufacturing point of view. Lamp housing 24 can be extended to hold the transparent panel adapter. By the same token shell 20 (FIG. 3) can be eliminated and the housing can be attached directly to the adjusting arm. This too is an obvious matter of convenience for assembly. Such modifications occurring to those skilled in the art are within the scope of this invention.

What is claimed is:

1. A device for projecting guide lines on a work surface, the device including (1) a projecting apparatus, (2) an apparatus base adapted to be attached to a table, wall or ceiling, (3) a connecting arm, (4) means for pivotally attaching one end of the connecting arm to the apparatus base, (5) means for swivelly connecting the other end of the connecting arm to the projecting apparatus, the pivotal means permitting the projecting unit to be moved vertically and horizontally relative to the base, the swivel means permitting the projecting apparatus to be rotated, the projecting apparatus (1) including (a) a housing, (b) a light source within the housing, (c) a transparent panel spaced therefrom so that light passes therethrough, and (d) a focusing lens carried by the housing so that the lens is between the transparent panel and the work surface, a retainer adapted to hold the transparent panel, means for rotating the transparent panel so that lines can be projected on the work surface at any angle, the transparent panel having on its surface a set of lines to be projected on the work surface, the lines being a set of nonparallel lines configured to correct for lens aberrations so that the lines are projected on the work surface as parallel guide lines.

2. The projecting apparatus of claim 1 wherein the focusing lens is a variable focal length lens.

3. The projecting apparatus of claim 1 wherein the focusing lens includes an adjustable aperture adapted to control the lens opening and hence the light passing through said lens.

4. A device for projecting guide lines on a work surface, the device including (A) a projecting apparatus, (B) an apparatus base adapted to be attached to a table, wall or ceiling, (C) a connecting arm, (D) means for pivotally attaching one end of the connecting arm to the apparatus base, and (E) means for swivelly connecting the other end of the connecting arm to the projecting apparatus, the pivotal means (D) permitting the projecting unit to be moved vertically and horizontally relative to the base, the swivel means (E) permitting the projecting apparatus to be rotated, the projecting apparatus (A) including (1) a housing, (2) a light source within the housing, and (3) a lens unit, the lens unit (3) including (a) a lens adapter, (b) a transparency seat within said lens adapter, and (c) a focusing lens fixed in the lens adapter and spaced therein so that the lens is between the transparent panel seat and the work surface, a transparent panel disposed in the transparency seat, the transparent panel having on its surface a set of lines to be projected on the work surface as guide lines, a retainer adapted to hold the transparent panel in said seat, and means rendering the lens adapter, and hence the transparent panel, rotatable so that the guide lines can be projected on the work surface at any angle.

* * * * *